United States Patent [19]

Mengel

[11] Patent Number: 4,860,380
[45] Date of Patent: Aug. 22, 1989

[54] AUTOPROGRAMMING TUNER APPARATUS

[75] Inventor: William H. Mengel, Marlton, N.J.

[73] Assignee: General Electric Company, Fairfield, Conn.

[21] Appl. No.: 298,856

[22] Filed: Jan. 19, 1989

Related U.S. Application Data

[63] Continuation of Ser. No. 80,274, Jul. 31, 1987.

[51] Int. Cl.$^4$ ............................................. H04B 11/16
[52] U.S. Cl. ...................................... 455/185; 455/186; 455/343; 358/190
[58] Field of Search ............... 455/161, 164, 165, 168, 455/185, 186, 197, 343, 151; 358/190, 193.1, 194.1

[56] References Cited

U.S. PATENT DOCUMENTS

| | | | |
|---|---|---|---|
| 3,940,702 | 2/1976 | Yoshimura et al. | 455/180 |
| 4,281,349 | 7/1981 | George | 455/343 |
| 4,457,021 | 6/1984 | Belisomi | 455/343 |
| 4,498,191 | 2/1985 | Rogers | 455/164 |
| 4,559,561 | 12/1985 | Amano et al. | 455/186 |
| 4,561,112 | 12/1985 | Ridder | 455/166 |
| 4,591,914 | 5/1986 | Hakamada et al. | 455/343 |
| 4,651,342 | 3/1987 | Mengel | 455/151 |

OTHER PUBLICATIONS

"RCA Color Television Basic Service Data", 1986 CTC 133.

Primary Examiner—Robert L. Griffin
Assistant Examiner—Curtis Kuntz
Attorney, Agent, or Firm—E. M. Whitacre; P. M. Emanuel; T. F. Lenihan

[57] ABSTRACT

A system for automatically programming an inexpensive volatile memory in an RF tuner with data relating to receivable active channels, upon activation of the receiver by a user after a power failure. Since the system is responsive to the application of standby power after a power failure, an automatic autoprogramming sequence does not occur each time the receiver is turned on by a user.

11 Claims, 1 Drawing Sheet

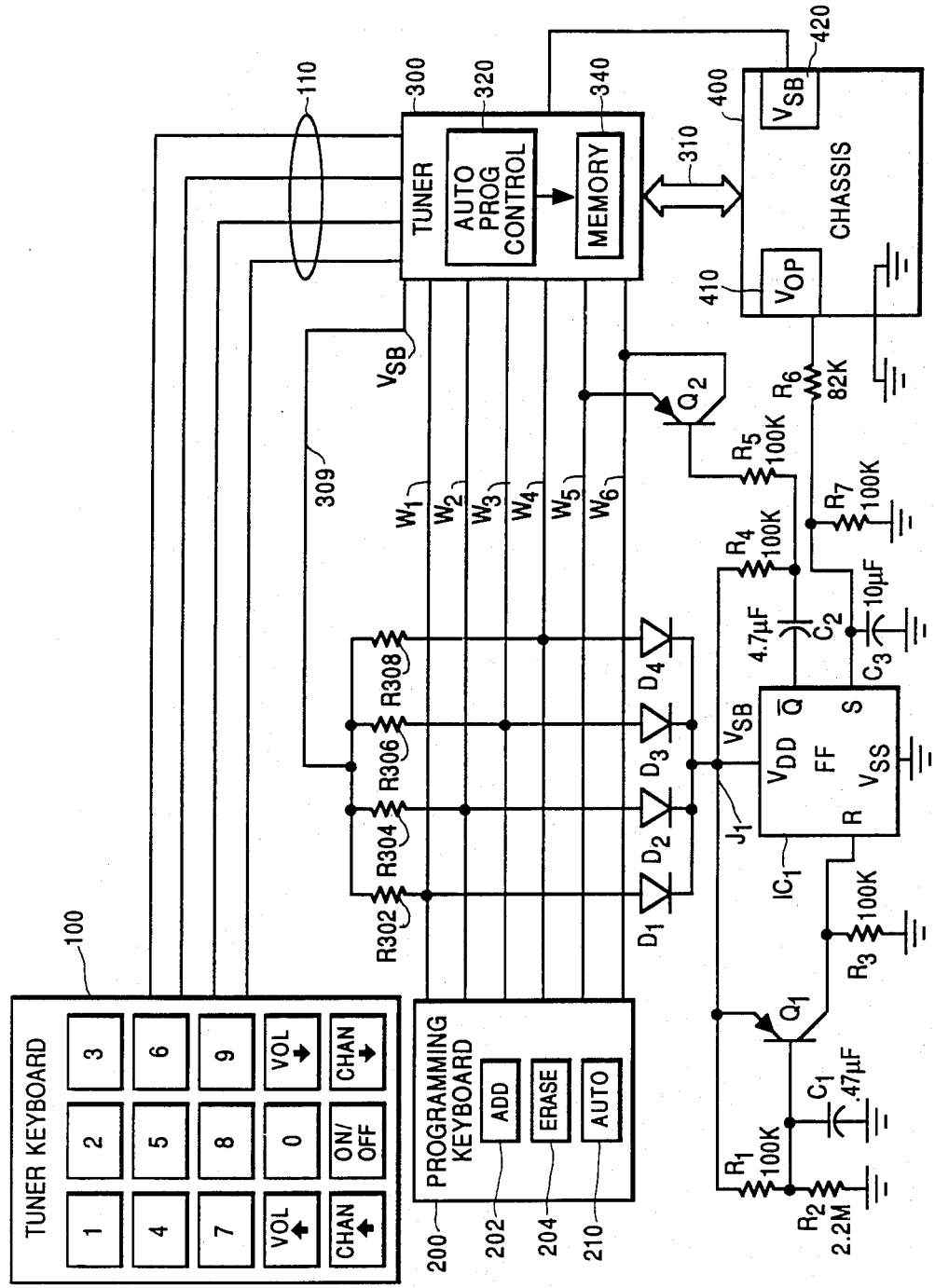

AUTOPROGRAMMING TUNER APPARATUS

This is a continuation of application Ser. No. 80,274 filed July 31, 1987.

FIELD OF THE INVENTION

This invention relates to the field of tuning systems which automatically scan the range of available channels and which program a memory device with data relating to the active channels found during the scan.

BACKGROUND OF THE INVENTION

In television receivers providing scan up and scan down features, it is well known to include a memory device to store active channel information to enable the receiver to skip over inactive channels and thus increase the tuning speed. It is also known that by the use of a delete key a user can delete marginally active as well as undesired, although active, channels from the list of those to be tuned.

Manual programming of the "skip list" into the memory can be a tedious process due to the large number of channels available in the United States and many other countries. A system employing autoprogramming of the memory is disclosed in U.S. Pat. No. 4,561,112 (Ridder) wherein a scan of available channels is performed automatically and a memory programmed is with active channel data. In this known system, the autoprogramming function is initiated by the user's pressing of keys which generate an "action-start" command.

The memory included within these systems may be volatile or non-volatile. Volatile memory has the disadvantage that a relatively costly standby power supply is necessary for maintaining the active channel data when the receiver is turned off. Non-volatile memory needs no standby power supply, but tends to be more expensive than volatile memory and is, therefore, also not a particularly cost effective solution to the problem of data retention during the periods when the receiver is turned off. Volatile memory becomes more cost effective than non-volatile memory when the standby power supply must be included for another purpose, such as for supplying power to a remote control receiver (which must be continuously powered in order to receive and process an "on" command for the receiver).

A problem arises with the use of standby power to maintain the data in memory because standby power is derived from the AC line and is therefore subject to interruption by AC power failures. Battery backup of the standby power supply for maintaining data stored in memory in consumer electronics devices is not desirable from a safety standpoint since the user would have to come in contact with circuitry connected to circuits within the cabinet to periodically change the batteries. The storage of a charge on a capacitor has been used in known systems to retain the data in memory but typically such systems retain the data only for a relatively short time, e.g., typically from several seconds to several minutes.

Two additional problems are peculiar to "commercial" versions of autoprogramming type receivers, for example, hotel or hospital television receivers. Users of these receivers are typically not familiar with the controls because they are not the owners of the receiver. Therefore, they cannot be expected to be able to, or be inclined to cause the institution's television receiver to be programmed. Also, such commercial versions of receivers may have the controls situated behind a locked door in the cabinet to discourage user readjustment because the non-familiarity of the user with &:he controls may lead to confusion, misadjustment and an unnecessary service call. In an institution operating a large number of receivers using volatile emory for storing skip lists, an AC power failure would cause a loss of programming information in all the receivers at once, necessitating reprogramming of all of them individually by an employee, a costly and time consuming process even if the employee has merely to turn each receiver on and press an autoprogramming key.

U.S. Pat. No. 3,940,702 (Yoshimura) discloses a system which, in addition to allowing autoprogramming anytime at the user's option, automatically reprograms itself every time the receiver is turned on by the user. Since this system reprograms itself each time it is turned on, the data stored in memory need not be preserved. This system has a disadvantage in that a user would quickly become annoyed with a receiver that took the time to scan all available channels every time it was turned on. Also, the list of channels may tend to change too frequently when the automatic reprogramming occurs each time the receiver is turned on considering that the receiver will be turned on at various times of the day and week and the channels may or may not be consistently active. Furthermore, it is quite possible that a user may intentionally delete an otherwise active channel from the memory device as a matter of personal preference. A system which autoprograms the memory device whenever the receiver is turned on would add the deleted channel back to the memory. Thus, the deleted channel will be tuned despite the wishes of the user.

SUMMARY OF THE INVENTION

A system is herein described which automatically scans the range of receivable channels and programs a memory device with active channel data when the receiver is first turned on after an AC power failure. The active channel information (skip list) is otherwise maintained in a low cost volatile memory by a standby power supply. Apparatus is disclosed for sensing the application of standby power and automatically initializing an autoprogram function upon the first activation of the receiver by a user. Automatic autoprogramming of the memory device is thereafter prevented until after the next occurrence of a power failure.

BRIEF DESCRIPTION OF THE DRAWING

The sole FIGURE illustrates, partially in block diagram form and partially in schematic diagram form, a preferred embodiment of the invention useful, for example, in a television receiver.

DETAILED DESCRIPTION OF THE DRAWING

Referring to the sole FIGURE, a user operable tuner control keyboard 100 is coupled via a four wire bus 110 to a tuner 300. Tuner 300 is responsive to key commands entered by the user via keyboard 100 to tune selected channels. Keyboard 100 may include, for example, keys which when operated generate the codes representative of the numerals 0-9, and the functions volume up, volume down, channel up, channel down, and ON/OFF. Tuner 300 is also coupled to a programming keyboard 200 having ADD 202, ERASE 204 and autoprogramming (AUTO) 210 keys for programming channel selection data into a memory 340 included within tuner 300. Tuner 300 communicates over and is powered via a multiwire bus 310 coupled between tuner 300 and a chassis 400. Chassis 400 derives video and audio signals from an IF signal produced by tuner 300 for ultimate display of the video signals on a picture tube (not shown), and ultimate application of the audio signals to a speaker (not shown)

Tuner 300 also includes an autoprogramming control circuit 320 which controls tuner 300 to scan the full range of memory and stores active channel data in an inexpensive volatile memory 340. Programming control keyboard 200 is coupled to tuner 300 via wires $W_1$, $W_2$, $W_3$, $W_4$, $W_5$, and $W_6$, and, as stated above, includes an autoprogramming key (AUTO) 210 which when operated by a user signals tuner 300 to begin an autoprogramming channel scanning operation. Specifically, when AUTO key 210 is pressed a short circuit is caused to appear between wires $W_5$ and $W_6$ signalling tuner 300 that the user desires that the autoprogram function be activated. Wires $W_1$-$W_4$ convey encoded data from ADD key 202, and ERASE key 204, included within programming keyboard 200, to tuner 300.

In order for the remote control circuitry (not shown) and the ON/OFF key of keyboard 100 to function, they must be powered by a standby power supply $V_{SB}$ 420 (located on chassis 400) during the period when the receiver is turned off and the source of operating power $V_{op}$ 410 is inactive. Tuner 300 applies $V_{SB}$ to wires of bus 110 and to wires $W_1$-$W_4$ via wire 309 and pull-up resistors $R_{302}$-$R_{308}$. The circuitry thus far described is known in the art, for example, from "RCA Color Television Basic Service Data" 1986 CTC133 available from RCA Technical Publications, Indianapolis, Ind. An inventive aspect of the apparatus will now be described in detail.

Diodes $D_1$-$D_4$ couple $V_{SB}$ from wires $W_1$-$W_4$ to the junction of one end of resistor $R_1$, the emitter electrode of $Q_1$, the $V_{DD}$ terminal of a set-reset (R-S) flip flop $IC_1$, and one end of resistor $R_4$. Resistor $R_2$ is coupled between the other end of resistor $R_1$ and a point of reference potential, e.g., ground. The junction point of resistors $R_1$ and $R_2$ is coupled to the base of transistor $Q_1$, and is coupled to ground via capacitor C1. The collector of transistor $Q_1$ is coupled to one end of resistor $R_3$ and to the reset input R of flip-flop $IC_1$. The remaining end of resistor R3 is coupled to ground, as is the $V_{SS}$ terminal of $IC_1$.

The $\overline{Q}$ output terminal of $IC_1$ is coupled to the junction of $R_4$ and $R_5$ via capacitor $C_2$, the remaining end of $R_5$ being coupled to the base of $Q_2$. The emitter and collector electrodes of $Q_2$ are connected to wires $W_5$ and $W_6$, respectively. $V_{op}$ from chassis 400 is coupled to the set input S of $IC_1$ via voltage divider $R_6/R_7$. The junction of resistors $R_6$ and $R_7$ is bypassed to ground via capacitor $C_3$.

The operation of the above-described circuitry is as follows. In the event of a power failure lasting longer than 3 to 5 seconds, the active channel data stored in volatile memory 340 is lost because it is maintained by standby power $V_{SB}$ which is dependent upon the AC line. When the power to the AC line is restored, $V_{SB}$ reappears at the anodes of $D_1$-$D_4$, is applied to junction $J_1$, and powers flip flop $IC_1$. Transistor $Q_1$ is caused to conduct for a period substantially determined by the time constant of the circuit comprising $R_1$ and $C_1$. The conduction of transistor $Q_1$ causes a pulse to appear on the reset input R of flip flop $IC_1$ which in turn causes the ovs/Q/ output of $IC_1$ to produce a high level signal.

Thus, the application of $V_{SB}$ has been detected, and stored in flip flop $IC_1$ which acts as a memory or storage device, retaining the information that a power failure has occurred and power has returned. No other function occurs until the receiver is turned on by a user.

When the user next turns on the receiver, $V_{op}$ is produced in chassis 400 and is coupled to the set input S of $IC_1$ via voltage divider $R_6/R_7$. The time constant of this circuit depends upon the value of $C_3$ and the ratio of $R_6$ to $R_7$, and delays the operation of the circuitry to allow the receiver to power-up normally. When the time delay expires, flip flop $IC_1$ is set causing its $\overline{Q}$ output to go low, which couples a low pulse via capacitor $C_2$ and resistor $R_5$ to the base of transistor $\overline{Q}_2$ Transistor $\overline{Q}_2$ is thereby biased into conduction, shorting wires $W_5$ and $W_6$ together until capacitor $C_2$ is substantially fully charged. The shorting of wires $W_5$ and $W_6$ causes the tuner to automatically scan its full range of channels and to reprogram volatile memory 340 with the data lost during the power failure.

After the operation of the autoprogramming circuitry, unwanted channels can be manually deleted from memory by user operation of the ERASE key 204. Similarly, additional channels may be added manually via operation of ADD key 202, for example, if one wishes to add a normally unused broadcast channel which is used by a VCR, videodisc player or video game.

When power returns after a power failure, or when the receiver is first plugged into the AC line, $V_{SB}$ is generated. Because the detection circuitry $R_1$, $C_1$, $Q_1$ is responsive to the initial application of $V_{SB}$, automatic autoprogramming will not occur every time the receiver is turned on by the user, but will only occur when it is needed (i.e., after a power failure has caused the loss of active channel data stored in the memory device). This feature relieves the user from the annoyance of waiting for the completion of an autoprogramming sequence every time the receiver is turned on.

Thus, a system has been described which solves the problems given above in reference to, for example, a hotel with a large number of autoprogramming television receivers, in that, after a power failure, the reprogramming of each receiver is performed automatically when a user next turns on the receiver.

What is claimed is:

1. In a receiver having autoprogramming means for performing an autoprogramming function of sequentially tuning a receiver through a range of channels and storing data related to achieve channels in memory means, apparatus for automatically controlling said autoprogramming means comprising:

a source of operating power energized when said receiver is turned on by a user;

a source of standby power having an energized state when said receiver is connected to a main source of AC power, and having a deenergized state when said receiver is not connected to said main source of AC power;

means coupled to said source of standby power for detecting a transition of standby power from said deenergized state to said energized state;

said data stored in said memory means being maintained when said source of operating power is deenergized;

means coupled to said source of operating power for detecting energization of said receiver by a user; and means coupled to said standby power transition detector means and to said receiver energization detection means for automatically causing the start of said autoprogramming function in response to the sequence of said detection of said transition of standby power and said first energization of said receiver by said user after said detection of said transition of standby power, and for preventing the automatic start of said autoprogramming function until after the next occurrence of said transition of standby power.

2. A system for automatically tuning a receiver through a range of channels and storing tuning data related to active channels in memory means comprising:

user-operable switch means for selectively causing said receiver to be energized;

a source of operating power coupled to said switch means and activated when said receiver is caused to be energized in response to the operation of said switch means by a user;

a source of standby power having an energized state when said receiver is connected to a main source of power and having a deenergized state when said receiver is not connected to said main source of power;

said data stored in said memory means being maintained when said source of operating power is deenergized;

tuning means having an autoprogramming control input and being responsive to an autoprogramming control signal applied to said autoprogramming control input for automatically scanning said range of channels and programming said memory means with said active channel data; and automatic autoprogramming control means responsive to the sequence of a transition of standby power from said deenergized state to said energized state and the first energization of said receiver in response to the operation of said switch means by said user for automatically generating said autoprogramming control signal.

3. A system for performing an autoprogramming function of autoprogramming tuning a receiver through a range of channels and storing tuning data related to active channels in memory means, comprising:

a source of operating power activated when said receiver is turned on;

a source of standby power having an energized state when said receiver is connected to a main source of power and having a deenergized state when said receiver is not connected to said main source of power;

said data stored in said memory means being maintained when said source of operating power is deenergized;

tuning means for tuning a selected channel of a plurality of channels;

said turning means having an autoprogramming control input and being responsive to an autoprogramming control signal applied to said autoprogramming control input for automatically scanning said range of channels and programming said memory means with said active channel data; and autoprogramming control means including, detector means coupled to said source of standby power for producing a detection signal upon detecting a transition of standby power from said deenergized state to said energized state;

storage means having a first input coupled to said detector means, a second input coupled to said source of operating power, and an output coupled to said autoprogramming control input of said tuning means;

said storage means being responsive to said detection signal for producing and storing said detection signal representing the detection of a transition of standby power from said deenergized state to said energized state, said storage means being thereafter responsive to the first application of said operating power to said second input to produce said autoprogramming control signal;

said turning means being responsive to said autoprogramming control signal to perform said autoprogramming control function.

4. The system of claim 3 wherein said storage means comprises a flip flop circuit.

5. The system of claim 4 wherein said detector means comprises:

a first resistor having a first end coupled to said source of standby power;

a first capacitor coupled between the second end of said first resistor and a source of reference potential; and a first transistor having a base electrode coupled to the junction of said first resistor and said first capacitor, an emitter electrode coupled to said source of standby power and a collector electrode coupled to said first input of said storage means.

6. The system of claim 5 wherein said autoprogramming control means further comprises:

delay means coupled between said source of operating power and said storage means for delaying the production of said autoprogramming control signal for a predetermined time interval.

7. The system of claim 6 wherein said delay means comprises a second resistor and a second capacitor.

8. The system of claim 7 wherein said autoprogramming control input comprises first and second terminals and said autoprogramming control means further comprises a second transistor having a base electrode coupled to said storage means and emitter and collector electrodes coupled to said first and second terminals, respectively, for receiving said autoprogramming control signal and applying said autoprogramming control signal to said tuning means by forming a low impedance path across said first and second terminals.

9. The system of claim 8 wherein said detector means and said storage means are connected together at a junction point and further comprising a diode coupled between said source of standby power and said junction point for coupling standby power to said detector means and said storage means.

10. In a receiver having an autoprogramming means for sequentially tuning a receiver through a range of channels and storing data related to active channels in memory means, apparatus for automatically controlling said autoprogramming means, comprising:

a source of operating power energized when said receiver is turned on by a user;

a source of standby power having an energized state when said receiver is plugged-in to a source of AC power and having a deenergized state when said receiver is not plugged in to said source of AC power;

said data stored in said memory means being maintained when said source of operating power is deenergized; and control means having a first input coupled to said source of operating power, a second input coupled to said source of standby power and an output coupled to said autoprogramming means for (a) detecting the first energization of said source of operating power following a transition of standby power from said deenergized state to said energized state;

(b) thereafter automatically controlling said autoprogramming means to being said tuning of said range of channels and said storing of said active channel data; and (c) thereafter preventing said automatic autoprogramming of said memory means of said receiver until after another occurrence of said transition of standby power.

11. In a tuning system having an autoprogramming means for performing an autoprogramming function of sequentially tuning said system through a range of channels and storing data related to active channels in memory means, apparatus for automatically controlling said autoprogramming means comprising:

switch means switchable operable for switching said system between an on-state and off-state;

a source of operating power energized when said system is switched to said on-state by a user;

a source of standby power having an energized state when said system is connected to a main source of power and having a deenergized state when said system is not connected to said main source of power;

said data stored in said memory means being maintained when said source of operating power is deenergized;

means coupled to said source of standby power for detecting a transition of standby power from said deenergized state to said energized state;

means for detecting when said system is in said on-state; and means coupled to said standby power transition detector means and to said on-state detection means for automatically causing the start of said autoprogramming function in response to the sequence of said detection of said transition of standby power and the first detection of said system being in said on-state after said detection of said transition of standby power, and for preventing the automatic start of said autoprogramming function until after the next occurrence of said transition of standby power.

* * * * *